United States Patent
Mitric

(10) Patent No.: US 7,126,429 B2
(45) Date of Patent: Oct. 24, 2006

(54) DIGITAL PHASE LOCKED LOOP WITH SELECTABLE NORMAL OR FAST-LOCKING CAPABILITY

(75) Inventor: Krste Mitric, Ottawa (CA)

(73) Assignee: Zarlink Semiconductor Inc., Kanata (CA)

( * ) Notice: Subject to any disclaimer, the term of this patent is extended or adjusted under 35 U.S.C. 154(b) by 0 days.

(21) Appl. No.: 10/951,798

(22) Filed: Sep. 29, 2004

(65) Prior Publication Data

US 2005/0258908 A1    Nov. 24, 2005

(30) Foreign Application Priority Data

Oct. 11, 2003    (GB)    ................... 0323936.5

(51) Int. Cl.
*H03B 7/07*    (2006.01)

(52) U.S. Cl. ............... 331/2; 331/16; 331/17

(58) Field of Classification Search ............ 331/2, 331/16, 17
See application file for complete search history.

(56) References Cited

U.S. PATENT DOCUMENTS

| | | |
|---|---|---|
| 5,065,115 A | 11/1991 | Pletz-Kirsch et al. |
| 5,511,100 A * | 4/1996 | Lundberg et al. ........... 375/376 |
| 5,612,980 A * | 3/1997 | Ledda et al. ................. 375/375 |
| 6,614,316 B1 * | 9/2003 | Masenas et al. .............. 331/17 |

FOREIGN PATENT DOCUMENTS

| | | |
|---|---|---|
| EP | 1104111 A1 | 5/2001 |
| GB | 2331192 A | 5/1999 |
| GB | 2357382 A | 6/2001 |

* cited by examiner

*Primary Examiner*—Joseph Chang
(74) *Attorney, Agent, or Firm*—Marks & Clerk; Richard J. Mitchell

(57) ABSTRACT

A digital phase locked loop with fast locking capability includes a digitally controlled oscillator for producing an output signal phase locked to an input reference clock, a phase detector for measuring the phase difference between said input reference clock and a feedback clock, and a loop filter for producing a control signal for the digitally controlled oscillator The loop filter includes a proportional circuit for developing a first signal proportional to said phase difference, an integrator for developing a second integrated signal from said first signal, an adder for adding said first and second signals to develop said control signal, and a weighting circuit, preferably a linear multiplier, for selectively adding extra weight to the first signal at an input to the integrator to shorten the locking time of the phase locked loop in a fast locking mode and to rapidly achieve a stable frequency in holdover mode.

29 Claims, 3 Drawing Sheets

DIGITAL PHASE LOCKED LOOP WITH SELECTABLE NORMAL OR FAST-LOCKING CAPABILITY

FIELD OF THE INVENTION

This invention relates to the field of digital signal synchronization. In particular, the invention relates to a digital phase locked loop (DPLL) with selectable fast-locking capability.

BACKGROUND OF THE INVENTION

In digital communications, where signal synchronization devices are used, there are often requirements for DPLLs that can meet certain standards which define their filter response, and also have the capability of fast locking to a reference signal. Fast locking is especially desired upon power-up and during manual clock reference rearrangement. The normal locking time for a DPLL is inversely proportional to its filter response, so fast locking is very useful when standards prescribe a slow response (small corner frequency).

In prior art DPLL implementations (e.g. the embedded DPLL in Zarlink's MT90866 H.110 Compatible Digital Switch), some instances of fast-locking have been achieved by pushing the DPLL corner frequency to the higher frequency range in the fast-locking mode. Quick response of the DPLL output clock to frequency changes of the active input reference clock could be achieved, as well as close alignment of the output clock edge to the active input reference clock edge. Locking time was very small for fairly large DPLL corner frequencies (i.e. greater than 1 kHz).

However, previous implementations fail to meet two major fast-locking mode requirements. Firstly, the holdover frequency could be far from the guaranteed holdover stability if holdover mode was entered shortly after the fast-locking time passes. In the holdover mode, the DPLL produces a stable output at the last locked frequency. Other techniques had to be used to prevent DPLL from entering holdover mode until the expiry of the normal DPLL locking time, which is defined by its filter response. Secondly, the final output clock was not aligned to the active input reference after this short, fast-locking time. The phase difference from the active input reference clock to the output clock was proportional to the sampling error of the active input reference clock by the internal clock used in DPLL. This misalignment could cause failures in a system where that DPLL was used as clock synchronizer, especially in systems with high clock and data rate, comparable to the sampling error.

SUMMARY OF THE INVENTION

The present invention provides a digital phase locked loop (DPLL), used for clock synchronization, which has a loop filter capable of providing a complete set of fast-locking functionality for a wide variety of filter responses. In addition, the DPLL provides normal locking functionality, prescribed by appropriate standards defining maximum output clock phase change, i.e. phase slope.

According to the present invention there is provided a digital phase locked loop with fast locking capability comprising a digitally controlled oscillator for producing an output clock phase locked to an input reference clock; a phase detector for measuring the phase difference between said input reference clock and a feedback clock; and a loop filter for producing a control signal for said digitally controlled oscillator, said loop filter comprising a proportional circuit for developing a first signal proportional to said phase difference; an integrator for developing a second integrated signal from said first signal; a weighting unit for selectively adding extra weight in a fast locking mode to said first signal at an input to said integrator to cause said integrator to build up its contents more rapidly and thereby shorten the locking time of the phase locked loop; and an adder for adding said first signal without said extra weight and said second signal developed by said integrator to develop said control signal for said digital controlled oscillator. Preferably, the weighting circuit is preferably a linear multiplier although it will be realized that other forms of weighting could be used.

The invention also permits the digital phase locked loop (DPLL) rapidly to achieve stable holdover frequency in holdover mode. The stable holdover frequency can be achieved within said fast locking time.

This invention resolves the issues regarding alignment of the output clock to the active input reference clock and holdover frequency stability in fast-locking mode. With this invention, both issues can be achieved in a very short period of time, called fast-locking time. The fast-locking time depends on the chosen DPLL filter response.

The resulting DPLL is capable of switching from one reference with a particular frequency offset to another reference with a different frequency offset that is far from the first reference frequency, in a very short time interval. The DPLL achieves the best possible alignment of the output clock to the active input reference clock and maintains guaranteed holdover stability. The same achievements can be accomplished upon system power up when local clocks must be synchronized to a network reference clock that has a large frequency offset.

A DPLL in accordance with the invention is capable of achieving almost absolute alignment of the output clock to the input reference signal within a very short time interval, for example, less than one second. The DPLL is also capable of achieving correct and accurate holdover frequency within the same short timeframe.

The DPLL can be used in different systems, such as the one defined by the ECTF H.110 standard, in which one synchronization device must be capable of locking to a network clock, performing jitter attenuation. The same device must be capable of locking to a backplane clock, where jitter attenuation is not permitted, and therefore allowing output clocks to be edge-synchronous to the backplane clock. Such a system requires error-free switching between the network and the backplane clocks, with holdover capabilities. The DPLL embodying the present invention enables the synchronization device to enter holdover mode after a very short period of time after switching reference inputs, thereby removing the necessity for any additional logic to be used to prevent entering holdover mode until expiring of normal locking time. This, in turn, reduces the cost of building such a system.

In accordance with the principles of the invention extra weight is added to the value of phase difference between the active input reference clock and the feedback clock, prior to passing it to an integrator. The same phase difference value, without extra weight, is passed to a proportional-integral adder. The adder output is a frequency offset used in a digital controlled oscillator (DCO) for desired output clock generation.

Adding extra weight to the integrator input in the DPLL loop filter allows the integrator to more quickly build up its content, which represents output clock frequency offset, based on changes of phase difference between the active input reference clock and the output (feedback) clock.

This technique becomes very efficient when quick filter response is chosen to speed up locking. In previous DPLL implementations, when the output clock was aligned to the active input reference clock within 1 LSB (Least Significant Bit), the quick filter response required elimination of phase detector sampling error noise of 1 LSB. To prevent amplification of the sampling error noise in accordance with the quick filter response, a non-linear transfer filter was used. In that case, depending on the filter response, the output clocks very quickly became aligned to the active input reference clock within 1 LSB. This alignment stopped amplification of the phase difference and slowed down the integrator from reaching its targeted value, therefore preventing final alignment of the output clocks to the active input reference clock. On the contrary, in the loop filter in accordance with the invention, the value of the phase difference on the integrator input will be given extra weight (additionally amplified), therefore allowing the integrator to reach its targeted value very quickly. Also, the final alignment of the output clock to the active input reference clock will, as usual, happen immediately after the integrator reaches its targeted value.

According to another aspect of the invention there is provided a method of controlling a digital phase locked loop wherein in a fast locking mode a loop filter applies a weighting factor to the proportional value of phase error (P-value), representing the phase difference between the an output clock and an active input reference clock, prior to passing it to an integrator, in order to achieve fast alignment of the output clock to the active input reference clock in a fast locking mode and fast achievement of stable holdover frequency in a holdover mode.

BRIEF DESCRIPTION OF THE DRAWINGS

Detailed description of the preferred embodiment of this invention is shown below, by way of example only, with reference to the accompanying drawings, in which.

DETAILED DESCRIPTION OF THE PREFERRED EMBODIMENT

The DPLL modules that do not directly contain the invention, but are important for understanding of the invention, will be explained in lesser detail. The modules of the DPLL containing the invention will be explained in greater detail.

Figure 1:
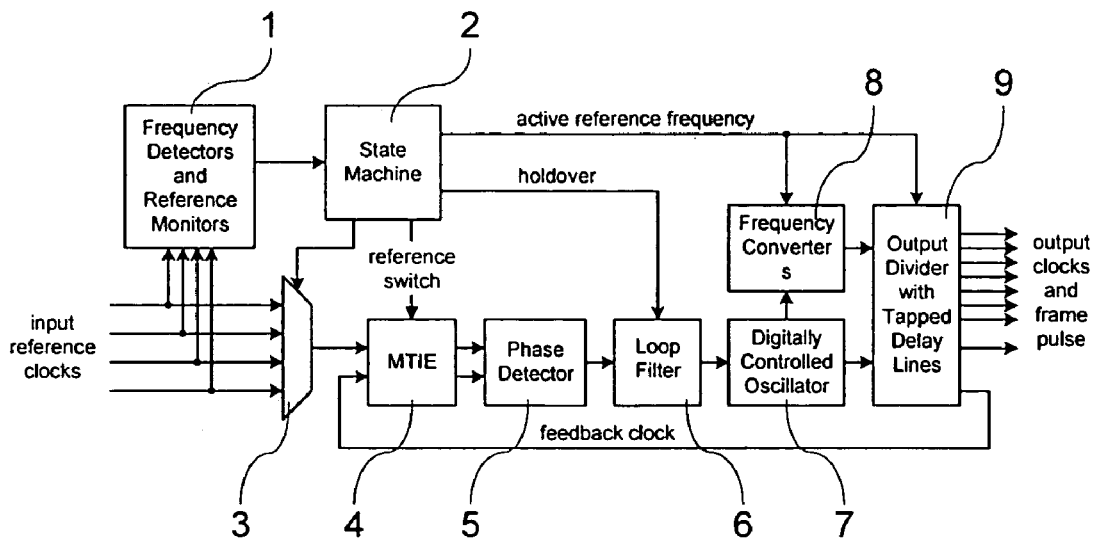
FIG. 1 is a top-level block diagram of the DPLL circuit, according to the preferred embodiment.

Referring to FIG. 1, the DPLL circuit that is capable of providing a complete set of both normal and fast-locking functionality consists of the following modules: four Frequency Detectors and Reference Monitors 1, State Machine 2, Input Reference Multiplexer 3, Maximum Time Interval Error (MTIE) module 4, Phase Detector 5, Loop Filter 6, Digitally Controlled Oscillator (DCO) 7, two Frequency Converters 8 and Output Divider with three Tapped Delay Lines (TDLs) 9.

The Frequency Detectors 1 determine the frequency of the incoming reference clocks and send coded binary value to the State Machine 2.

The Reference Monitor modules 1 monitor the existence and frequency offset of the input reference clocks and notify the State Machine module 2 about the reference clock reliability. Hysteresis functionality is implemented in the Reference Monitor modules 1, such that bouncing among references is prevented when frequency offset of the preferred input reference clock is close to the reliability boundary.

The State Machine 2 controls the Input Reference Multiplexer 3, selects appropriate frequency information corresponding to the selected reference, activates the measurement cycle of the MTIE (Maximum Time Interval Error) module 4 and switches the DPLL automatically to and from holdover mode. The four input references have equal priority and any one can be selected as the preferred reference. If the preferred reference fails specified timing criteria, the State machine 2 will lock the DPLL to the next non-failing reference, or switch the DPLL into the holdover mode if all four references fail.

The Input Reference Multiplexer 3 selects one of four input reference clocks as the input clock for the DPLL.

The MTIE module 4 compensates for the phase offset between the newly selected input reference clock and the DPLL output clock in case of a reference switch or a recovery from holdover mode. Immediately after the new input reference clock is selected to be the DPLL input clock, the MTIE module 4 is activated by the State Machine 2 to start a measurement process, in which the phase difference between the new reference clock and the DPLL feedback clock is recorded. After the measurement process is done, the measured phase difference is maintained between the new reference clock and the output clock. The 'feedback clock' signal is delayed inside the MTIE module 4 to match the active reference delay and passed to the Phase detector module 5.

The Phase Detector 5 measures the difference in phase between the input reference clock and the output feedback clock on every reference clock edge and converts it to a signed binary number representation. The output value of the Phase Detector 5 is made to always be odd, to prevent the appearance of a 'dead zone' which could change the DPLL response and add uncertainty to the alignment of the DPLL output clock to the active input reference clock. The measured phase error, the Phase Detector output, is passed to the Loop Filter 6.

The Loop Filter 6 is a central part of this invention and it will be explained in greater detail later. In general, for normal locking mode functionality, the Loop Filter 6 performs output phase slope limiting, filtering of the phase error generated in the Phase Detector 5 and conversion of the phase error to a frequency offset for the DCO 7. When fast-locking mode is selected, the Loop Filter 6 multiplies the phase error from the Phase Detector 5 to achieve appropriate filter response, defined by the DPLL corner frequency, and performs additional multiplication of the proportional value (P-value) prior to its integration, therefore implementing fast-locking functionality. The non-multiplied proportional part is added to the integrated part and passed as frequency offset to the DCO (Digital Controlled Oscillator) module 7. The Loop Filter 6 also allows software control over the frequency offset of the DPLL output clocks, when it is not desirable to match the active input reference frequency offset.

The DCO 7 generates a clock that is phase-locked to the input reference clock. The system clock and the center frequency number inside the DCO module 7 determine frequency of the generated clock. The frequency offset value from the Loop Filter 6 is added to the center frequency number such that phase of the feedback clock, coming from the generated clock, is shifted toward reducing the phase error.

The Frequency Converters 8 are used to generate output clocks that are not directly divisible from the DCO generated clock. The DCO value, representing the current phase of the DCO generated clock relative to its ideal position, is multiplied by a constant fraction, thereby generating a clock with a frequency that is a fraction of the DCO output clock frequency.

The TDLs (Tapped Delay Lines) 9 are used to minimize intrinsic jitter on the DCO generated clock and two clocks generated by Frequency Converters 8. The intrinsic jitter on the TDL input represents DCO and Frequency Converters errors. The jitter is determined by the phase of the generated clocks relative to their ideal positions. The role of the TDLs 9 is to minimize intrinsic jitter by delaying the DCO and Frequency Converters' generated clocks to be as close as possible to the ideal clock position.

The Divider module 9 is used to generate all required output clocks and the DPLL feedback clock by dividing generated clocks from the DCO 7 and two Frequency Converters 8. For proper alignment of the clocks coming from the Frequency Converters 8 with the clocks coming from the DCO 7, a special technique is implemented:

The Divider module 9 is reset later than the rest of the DPLL, waiting for the TDL clocks to achieve initial stabilization. The counters used for dividing clocks from the Frequency Converters 8 are then preloaded with appropriate values. Since the relation of the DCO clocks and the Frequency Converters clocks is fixed and repeatable with a given time base (e.g. after every 125 microseconds), proper initialization of the counters is sufficient to maintain alignment of the clocks coming from the Frequency Converters 8 to the clocks coming from the DCO 7, in the time base intervals. The feedback clock frequency is chosen to match the active input reference's clock frequency.

Loop Filter Module

Figure 2:
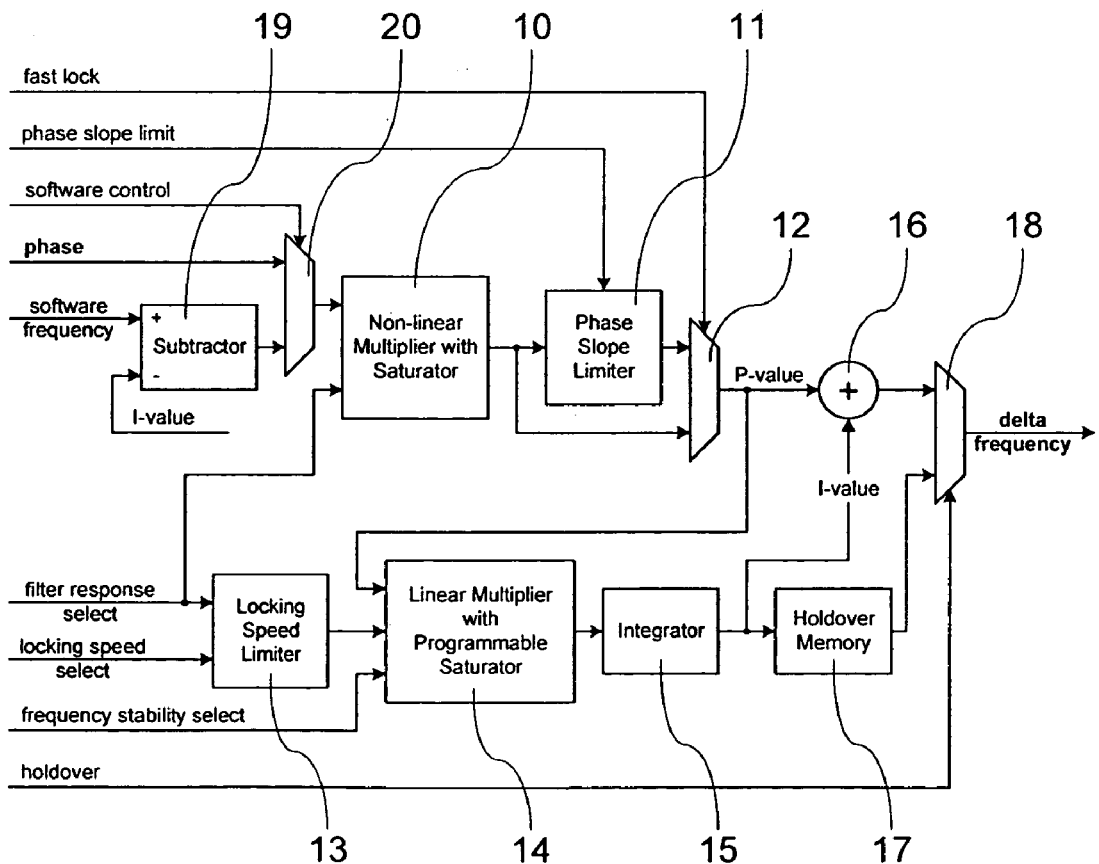
FIG. 2 is a block diagram of the loop filter module in FIG. 1.

The Loop Filter circuit 6 implements a first-order low-pass filter. Referring now to FIG. 2, the Loop Filter module consists of the following sub-modules: Non-linear Multiplier with Saturator 10, Phase Slope Limiter 11, Locking Speed Limiter 13, Linear Multiplier with Programmable Saturator 14, Integrator 15, P+I Adder 16, Holdover Memory 17, Subtractor 19 and three Multiplexers 12, 18 and 20.

The phase error from the Phase Detector module 'phase' is first multiplied in the Non-linear Multiplier 10 and saturated in the Saturator 10 to the maximum value, regardless of whether normal or fast-locking functionality is required. The multiplication factor 'filter response select' defines the DPLL filter response, i.e. its corner frequency. Functionality of the Non-linear Multiplier with Saturator 10 will be explained in more detail later.

The multiplied phase error value is limited inside Phase Slope Limiter 11, such that modulo of the multiplied phase error is within a specified value defined by the 'phase slope limit'. In normal locking mode, the proportional value of the P+I Adder ('P-value') is selected to be the output of the Phase Slope Limiter 11. In fast-locking mode, the Phase Slope Limiter 11 is bypassed, and the multiplied phase error is selected to become 'P-value'.

To achieve fast-locking functionality, the Linear Multiplier with Programmable Saturator module 14 performs additional multiplication of the 'P-value' prior to entering Integrator input, if fast-locking functionality is desired. In normal locking mode, the multiplication factor is 1 (no multiplication is performed).

The multiplication factor of the Linear Multiplier with Programmable Saturator module 14 comes from the Locking Speed Limiter module 13. The 'locking speed select' value is limited using a special limiting algorithm, which will be explained in more detail below.

When the requirements of a standard for the DPLL output phase peaking are not too tight, the Linear Multiplier with Programmable Saturator 14 can be used together with the Phase Slope Limiter 11 to shorten normal-locking time, while the DPLL can still maintain required phase slope. The multiplication factor depends on required peaking.

The Integrator module 15 consists of an accumulator and an attenuator, i.e. divider. The 'P-value' is accumulated in the accumulator. The attenuation of the accumulated value is done to prevent oscillating of the DPLL. The output of the attenuator is an integral part of the P+I Adder ('I-value'). The 'I-value' represents frequency offset of the active input reference clock when the DPLL is locked.

Adding of the 'P-value' to the 'I-value' in the P+I Adder 16 results in the frequency offset for the DCO module 7, called 'delta frequency', if the DPLL is not in the holdover mode. The I-value is periodically stored in the Holdover memory 17, and the 'old', previously stored value is used as the frequency offset when the DPLL is in the holdover mode.

The DPLL allows outside software control over the 'delta frequency', when 'software control' is active. The functionality is implemented by adding Subtractor module 19, which subtracts the 'I-value' from provided 'software frequency', that represents the desired DPLL output clocks' frequency offset. This allows the DPLL, when under software control, to follow a chosen filter response and phase slope. The update interval of the 'software frequency' doesn't have limits and can be as small as the system requires.

Non-linear Multiplier with Saturator

The Role of the Non-linear Multiplier with Saturator sub-module 10 of the Filter module 6 is to provide 16 different filter responses of the DPLL, i.e. 16 different corner frequencies, ranging from 0.47 Hz to 15.5 kHz.

Figure 3:
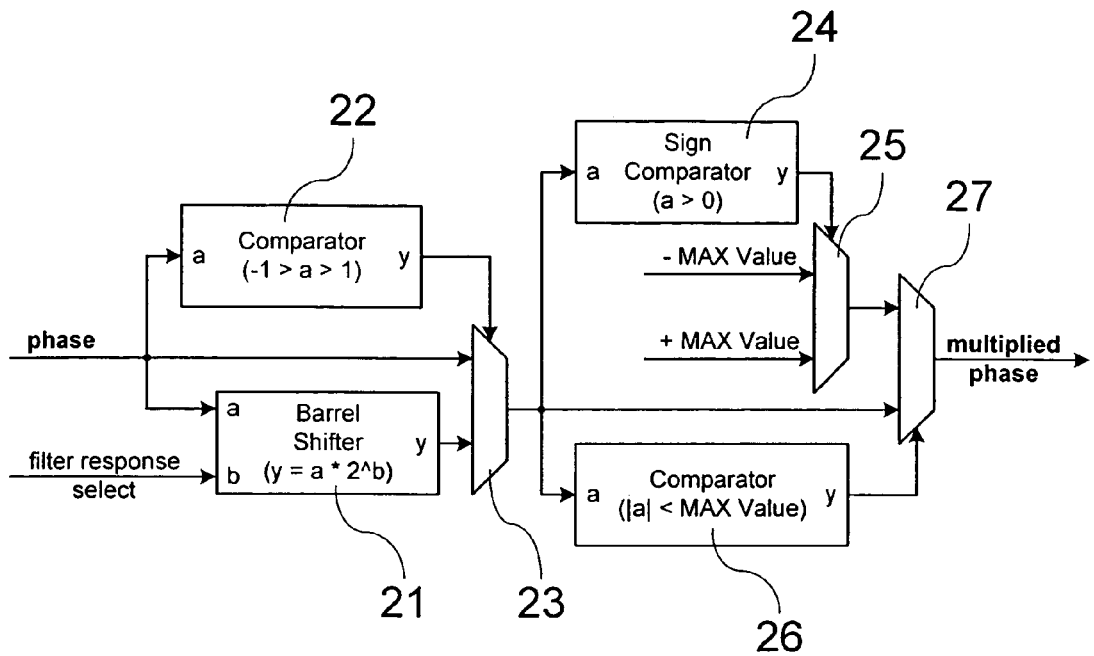
FIG. 3 is a block diagram of the non-linear multiplier with saturator in FIG. 2.

As shown in FIG. 3, the Non-linear Multiplier with Saturator 10 consists of the following components: Barrel Shifter 21, three Comparators 22, 24 and 26, and three Multiplexers 23, 25 and 27.

Non-linear functionality, represented by the fact that the 'phase' is not multiplied if its value is within +/−1 boundary, is necessary to stabilize the DPLL output frequency once the DPLL aligns its output clocks to the active input reference clock. Non-linear functionality is implemented by using Barrel Shifter 21, Comparator 22 and Multiplexer 23.

The multiplied phase value is then saturated to be within hard-coded +/−MAX Value, which is chosen to prevent overflow in the accumulator of the DCO module 7. Two Comparators 24 and 26, and two Multiplexers 25 and 27 are used to implement saturation function.

Linear Multiplier with Programmable Saturator

The fast-locking functionality is based on additional multiplication of the 'P-value', which speeds up the Integrator 15 in achieving its targeted value. The linear multiplication is used since the largest portion of the entire locking time belongs to the final phase alignment of the DPLL output clocks to the active input reference clock. During this final alignment, the 'P-value' is most often either +1 or −1. One value occurs more often than the other, depending which direction the final alignment must be performed. The absence of the multiplication factor for +1 and −1 values, if a non-linear filter is used, would result in the taking a similar amount of time for the final alignment regardless of DPLL filter response selection. The linear multiplication, used in this invention, assumes that the 'P-value' of +1 and −1 is additionally multiplied as well, causing a significant drop in locking time, compared to usage of a non-linear multiplier.

Figure 4:
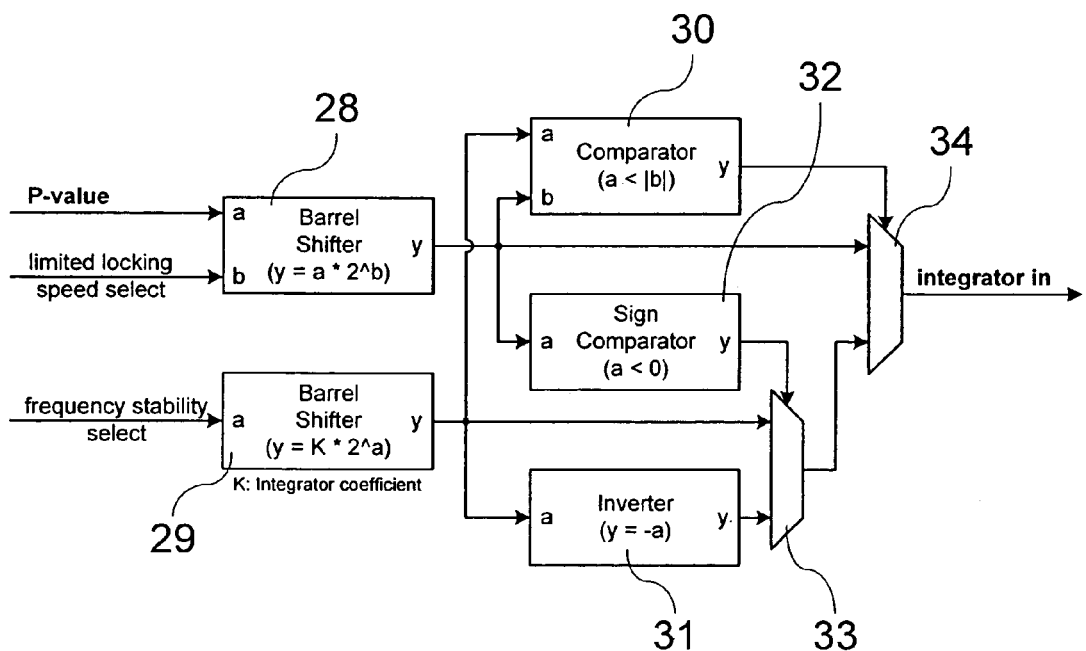
FIG. 4 is a block diagram of the linear multiplier with programmable saturator in FIG. 2.

Referring now to FIG. 4, the Linear Multiplier with Programmable Saturator sub-module 14 of the Filter module 6 consists of two Barrel Shifters 28 and 29, two Comparators 30 and 32, Inverter 31 and two Multiplexers 33 and 34.

For the 'P-value' multiplication, the Barrel Shifter 28 is used. Another input of the Barrel Shifter 28 is 'limited locking speed select' input, which determines the fast-locking speed of the DPLL.

In order to stabilize the DPLL output clocks in fast-locking mode when a significant amount of jitter is present on the DPLL active input reference clock, the multiplied 'P-value' can be saturated to a maximum value, defined by 'frequency stability select'. The Barrel Shifter 29 is used to generate maximum value for the 'integrator in', which is the input to the Integrator sub-module 15 of the Filter module 6. Constant number 'K', which represents attenuation coefficient of the Integrator 15, is used in the Barrel Shifter 29.

The multiplied "P-value' in the Barrel Shifter 28 is compared against the maximum value, calculated inside the Barrel Shifter 29, and passed to the 'integrator in' if it is within +/− of the maximum value. If the multiplied 'P-value' is outside the maximum value, either the maximum value, or the inverted value in 2's complement is passed to the 'integrator in', depending on the sign of the 'P-value'. The inversion of 2's complement 'P-value' is done inside the Inverter component 31.

The 'limited locking speed select', generated inside the Locking Speed Limiter sub-module 13 of the Filter module 6 from 'locking speed select' and 'filter response select' values, is chosen such that stable DPLL output clocks are generated, regardless of what value for 'locking speed select' can be provided. The 'locking speed select' value is automatically limited depending on the 'filter response select' value, according to the curve shown in FIG. 5.

Figure 5:
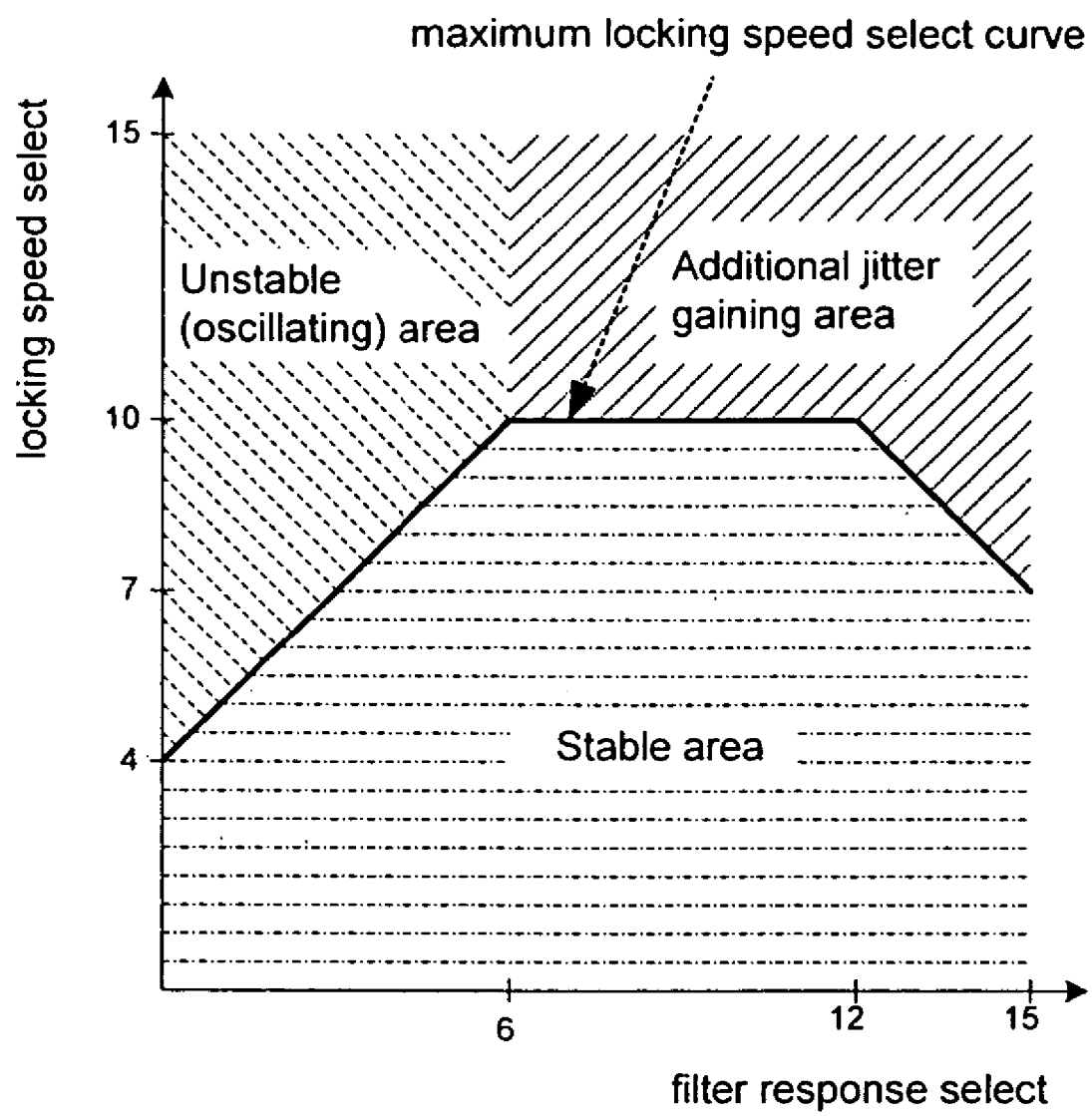
FIG. 5 is the limitation diagram of the locking speed limiter in FIG. 2.

Referring now to FIG. 5, when a small value for 'filter response select' and a large value of 'locking speed select' is chosen, the DPLL appears to be unstable (i.e. oscillating). Under these circumstances, the 'I-value' becomes predominant over the 'P-value', which prevents the Integrator sub-module 15 of the Filter module 6 from stabilizing to the targeted value defined by the active input reference clock frequency offset, therefore preventing the DPLL from locking its output clocks to the active input reference clock.

When the 'filter response select' values are chosen to be large enough to prevent oscillation, there is still a limitation for the 'locking speed select' values. If a big 'locking speed select' value is chosen together with a big 'filter response select' value, the DPLL output clocks will gain extra intrinsic jitter, as a result of having excessively large values on the Integrator input. The Integrator content will stabilize around its targeted value defined by the active input reference clock frequency offset, but very small phase variation will cause the Integrator content to move up and down, causing false realignment of the output clocks to the active input reference clock, therefore adding extra jitter on the output clocks and less accurate holdover frequency.

The 'maximum locking speed select curve' consists of three parts: rising, straight and falling. The rising part is related to the small 'filter response select' values (i.e. up to 6) when the limit for the value linearly rises to the point where the 'I-value' becomes predominant. The straight part is related to the values of 'filter response select' where larger 'locking speed select' values would cause the input of the Integrator to be big enough such that a small phase change can cause changes in the output frequency offset, therefore gaining extra jitter on the output clocks. The last, falling part, is related to largest values of the 'filter response select' where increasing the 'filter response select' requires the maximum value of the 'locking speed select' to decrease in order to prevent additional jitter gain on the DPLL output clocks, caused by saturations of both 'multiplied phase' and 'integrator in' for small changes of the 'phase' value.

The DPLL in accordance with the invention includes a loop filter which is capable of providing complete fast-locking functionality over sixteen selectable corner frequencies, in addition to normal locking functionality that is prescribed by appropriate standards which define maximum output clock phase change (i.e. phase slope), maximum wander accumulation (i.e. peaking), etc.

The loop filter multiplies the proportional value of phase error (P-value), representing the phase difference between the DPLL output clocks and the active input reference clock, prior to passing it to an integrator in order to achieve fast alignment of the DPLL output clocks to the active input reference clock and fast achievement of stable holdover frequency, i.e. fast-locking functionality of the DPLL. A programmable multiplier of the phase error controls the fast-locking speed of the DPLL.

The combination of non-linear multiplication of the phase error, used to form frequency offset for the digitally controlled oscillator (DCO), with linear multiplication of the multiplied phase error, used as input to the integrator, achieve fast locking with stable holdover frequency of the DPLL.

The saturator with selectable saturation value limits the integrator input in order to achieve the DPLL output clock stability, depending on amount of jitter present on the DPLLs active input reference clock. The saturation of the multiplied phase error value prevents overflow of the accumulator of the DCO.

Limiting locking speed of the DPLL prevents oscillating and additional jitter gaining on the DPLL output clocks. The clocks coming from frequency converters of the DPLL to clocks coming from the DCO can be aligned in repeatable time intervals, e.g. every 125 microseconds.

Hysteresis functionality inside the reference monitors of the DPLL prevents bouncing among references when the frequency offset of the preferred input reference clock of the DPLL is close to the reliability boundary.

The invention permits software control over the DPLL output clocks' frequency, following chosen DPLL filter response and phase slope, with no limitation over frequency offset update interval.

This invention can form the embedded DPLL of a digital switch. The DPLL can be implemented in silicon or as an FPGA.

What is claimed is:

1. A digital phase locked loop with selectable fast locking capability comprising:
   a digital controlled oscillator for producing an output clock phase locked to an input reference clock;

a phase detector for measuring the phase difference between said input reference clock and a feedback clock; and a loop filter for producing a control signal for said digitally controlled oscillator, said loop filter comprising:

a proportional circuit for developing a first signal proportional to said phase difference;

an integrator for developing an integrated signal from said first signal;

a weighting unit for selectively adding extra weight as a weighting factor in a fast locking mode to said first signal at an input to said integrator to cause said integrator to build up its contents more rapidly and thereby shorten the locking time of the phase locked loop, said weighting factor being in the form of a multiplier that multiples said first signal; and an adder for adding said first signal without said extra weight and said integrated signal developed by said integrator to develop said control signal for said digital controlled oscillator.

2. A digital phase locked loop as claimed in claim 1, wherein said weighting unit also permits the achievement of stable holdover frequency in holdover mode within said locking time.

3. A digital phase locked loop as claimed in claim 1, wherein said weighting unit is a linear multiplier.

4. A digital phase locked loop as claimed in claim 3, wherein said linear multiplier includes a barrel shifter to multiply said first signal.

5. A digital phase locked loop as claimed in claim 4, wherein said barrel shifter has a first input for said first signal and a second input for receiving a locking speed select signal.

6. A digital phase locked loop as claimed in claim 5, wherein said linear multiplier includes a saturator to saturate said first signal to a maximum value at the input to said integrator.

7. A digital phase locked loop as claimed in claim 6, wherein said saturator is programmable and said maximum value is defined by a frequency stability select signal.

8. A digital phase locked loop as claimed in claim 6, wherein said saturator includes a second barrel shifter developing said maximum value and receiving said frequency select signal at its input.

9. A digital phase locked loop as claimed in claim 3, wherein said proportional circuit includes a non-linear multiplier for providing non-linear functionality when said phase difference is within predefined limits.

10. A digital phase locked loop as claimed in claim 9, wherein said non-linear multiplier includes a third barrel shifter, a comparator and a multiplexer.

11. A digital phase locked loop as claimed in claim 10, wherein said non-linear multiplier further includes a second saturator to saturate the multiplied phase error value to prevent overflow of an accumulator of the digital controlled oscillator.

12. A digital phase locked loop as claimed in claim 11, wherein said second saturator includes comparators and multiplexers to implement the saturation function.

13. A digital phase locked loop as claimed in claim 3, further comprising a locking speed limiter providing a control input to said linear multiplier, said locking speed limiter having a locking speed select input and a filter response select input.

14. A digital phase locked loop as claimed in claim 3, further comprising a reference monitor component receiving a plurality of input reference clocks and implementing hysteresis functionality is such that bouncing among said reference input clocks is prevented when frequency offset of the preferred input reference clock is close to the reliability boundary.

15. A digital phase locked loop as claimed in claim 14, further comprising a state machine component receiving reliability information from said reference monitor component and controlling an input reference clock multiplexer to select an appropriate input reference clock.

16. A digital phase locked loop as claimed in claim 15, wherein said state machine has equal priority over each said input reference clock.

17. A digital phase locked loop as claimed in claim 1, wherein said proportional circuit includes a multiplier for multiplying said phase difference, a slope limiter for said multiplied phase difference, and a bypass for bypassing said slope limiter in said fast locking mode.

18. A digital phase locked loop as claimed in claim 15, wherein said state machine selects appropriate frequency information corresponding to the selected reference clock, activates the measurement cycle of a MTIE (Maximum Time Interval Error) component and switches the digital phase locked loop automatically to and from a holdover mode.

19. A method of controlling a digital phase locked loop wherein in a fast locking mode a loop filter applies a weighting factor in the form of a multiplier to the proportional value of phase error (P-value), representing the phase difference between the an output clock and an active input reference clock, prior to passing it to an integrator, in order to achieve fast alignment of the output clock to the active input reference clock in a fast locking mode and fast achievement of stable holdover frequency in a holdover mode.

20. A method as claimed in claim 19, wherein said proportional value is multiplied with a programmable multiplier.

21. A method as claimed in claim 20, wherein said programmable multiplier is linear.

22. A method as claimed in claim 21, wherein non-linear multiplication of the phase error, used to form frequency offset for a digitally controlled oscillator, is combined with linear multiplication of the multiplied phase error, used as input to the integrator, to achieve fast locking with stable holdover frequency of the DPLL.

23. A method as claimed in claim 19, wherein a selectable saturation value is used to limit the integrator input in order to achieve output clock stability depending on amount of jitter present on the input reference clock.

24. A method as claimed in claim 19, wherein the multiplied phase error value is selectively saturated to prevent overflow of an accumulator of a digitally controlled oscillator.

25. A method as claimed in claim 19, wherein the locking speed of the digital phase locked loop is limited to prevent oscillation and additional jitter the output clock.

26. A method as claimed in claim 19, wherein hysteresis functionality is implemented to prevent bouncing among reference inputs when frequency offset of a preferred active input reference clock is close to the reliability boundary.

27. A method as claimed in claim 19, wherein software control of the output clock frequency is implemented in accordance with a selected filter response and phase slope.

28. A method as claimed in claim 19, wherein an active reference input is selected from a group of reference inputs by a state machine that gives equal priority to each reference input of the digital phase locked loop.

29. A method as claimed in claim 19, further comprising multiplying the value of said phase difference to develop said proportional value, and in normal mode passing said multiplied value of said phase difference through a slope limiter, and in fast locking mode bypassing said slope limiter.

* * * * *